United States Patent [19]

Kasson et al.

[11] 4,187,466

[45] Feb. 5, 1980

[54] SIGNAL INJECTION TECHNIQUE

[75] Inventors: James M. Kasson, San Mateo; Martin H. Graham, Berkeley, both of Calif.

[73] Assignee: Rolm Corporation, Santa Clara, Calif.

[21] Appl. No.: 869,745

[22] Filed: Jan. 16, 1978

[51] Int. Cl.² ............................................. H04B 1/00
[52] U.S. Cl. ..................................... 325/42; 325/65; 340/347 AD
[58] Field of Search ............. 325/42, 65, 38 R, 38 A, 325/41; 340/347 AD; 178/68

[56] References Cited

U.S. PATENT DOCUMENTS

| | | | |
|---|---|---|---|
| 3,244,808 | 4/1966 | Roberts | 325/65 |
| 3,562,420 | 2/1971 | Thompson | 325/42 |
| 3,614,622 | 10/1971 | Holsinger | 325/42 |
| 3,641,433 | 2/1972 | Mifflin | 325/65 |
| 3,656,152 | 4/1972 | Gunderson | 340/347 AD |
| 3,877,022 | 4/1975 | Lehman | 340/347 AD |
| 3,999,129 | 12/1976 | Kasson | 325/65 |
| 4,065,718 | 12/1977 | Attwood | 325/65 |

Primary Examiner—Robert L. Griffin
Assistant Examiner—Michael A. Masinick
Attorney, Agent, or Firm—Townsend and Townsend

[57] ABSTRACT

In a digital information transmission system having an analog-to-digital converter (ADC), an information transmission medium, and a digital-to-analog converter (DAC) all located between a transmitting station and a receiving station, signal transmission is improved by injection of a controlled signal in the form of a symmetric triangle wave sweep having a maximum peak-to-peak amplitude exceeding the magnitude of a few quantization intervals of the ADC and the DAC, introducing frequency components concentrated outside the system frequency spectrum. A class of controlled signals is disclosed. In the preferred embodiment, the controlled signal is injected into the analog information input signal prior to conversion to digital form. The injected signal predominates whenever the amplitude of spurious noise signals is less than the amplitude of the injected signal and the level of the input of the ADC is near a quantizing interval transition point so that subsequent analog output signals from the DAC have frequencies concentrated outside the frequency spectrum of the system. The DAC output signals are subsequently filtered by a post-sampling filter having a pass-band characteristic coextensive with the system frequency spectrum so that the injected signal components are removed before coupling to the signal output utilization device. Alternatively, a digital representation of the controlled signal may be added to the information signal after conversion to digital form and subsequently filtered from the information signal.

22 Claims, 18 Drawing Figures

FIG._1.

| A | B | C | D |
|---|---|---|---|
| NUMBER OF LEVELS IN TRIANGULAR WAVE SWEEP (n) | NOISE RELATIVE TO NOISE WITH A PERFECT MATCH FOR WORST MISMATCH IN DB. ($10 \log \frac{n+1}{n}$) | LEVEL OF BASIS SIGNAL COMPARED TO MINIMUM (1 QUANTA LEVEL) | LOSS OF RANGE IN 4096 LEVEL SYSTEM |
| 1 | 3.01 db | 0 db | .004 db |
| 2 | 1.76 db | 6 db | .008 db |
| 3 | 1.25 db | 9.5 db | .013 db |
| 4 | .97 db | 12 db | .017 db |
| 5 | .79 db | 14 db | .021 db |

SIGNAL INJECTION TECHNIQUE

BACKGROUND OF THE INVENTION

1. Field of the Invention

This invention relates to information transmission systems in which information is transmitted between two or more stations in digital form. More particularly, this invention relates to the reduction of errors in digital information transmission systems by utilizing a controlled signal dithering technique.

In the field of information transmission it is common practice to convert information from analog to digital form prior to transmission from a station at a first location and to re-convert the information received at a second location from digital to analog form. In a typical system, the analog-to-digital conversion is accomplished by sampling successive portions of the analog input signal at a rate sufficient to permit conversion in a theoretically errorfree manner under idealized conditions and generating a substantially constant level signal for the duration of each sampling period, the magnitude of the constant level signal during any given period being representative of the magnitude of the analog signal at the instant of sampling. The magnitude of the constant level signal is limited to a relatively small fixed number of possible values over the entire predetermined amplitude range of the analog input signal, a process termed quantizing, and each value is assigned a different amplitude range or quantizing interval so that all signal amplitudes lying within a specific quantizing interval are converted to a constant level signal having the same magnitude. For example, in a seven bit binary system, an analog input signal having amplitudes lying in the range from zero to 1.28 volts may be quantized into different levels each having a range of 0.01 volts so that input signals having amplitudes lying in the zero level range from −0.005 to +0.005 volts are converted to a zero volt level signal; input signals having amplitudes lying in the range from 0.005 to 0.015 volts are converted to a constant level signal having the magnitude of 0.01 volts; signals from 0.015 to 0.025 volts are converted to a constant level signal having a magnitude of 0.02 volts; etc. The voltage magnitudes 0.005, 0.015, 0.025, etc., defining the end points of each range, are termed the transition points or quantization levels. The intervals between the transition points are termed quantization interval. Ideally the quantization intervals are equal in value and define one significant bit (LSB). At the receiving station, the information transmitted in digital form is ordinarily re-converted to analog form which is accomplished in the inverse manner to the manner described above.

Such systems have found wide application, and they are increasingly being used in telephone systems for transmitting speech and other analog information. Such systems are typically designed to operate over a predetermined range of analog input signal frequencies. For example, in a telephone system application, this range is ordinarily in the audible range from about 300 Hz to about 3400 Hz. System response is limited to this range by filtering of the analog input signals prior to the analog-to-digital conversion by means of a band-pass filter having a pass-band characteristic lying in the 300–3400 Hz range and by filtering the reconverted analog signal with a post-sampling filter having similar pass-band characteristics.

Such systems, however, suffer from the disadvantage of susceptibility to random disturbing signals upstream of the analog digital converter (ADC) and lying in the frequency response range of the system, which signals are conveniently termed noise signals, as opposed to information signals whose information content is to be transmitted to the receiving station. In the presence of noise signals, the information content desired to be transmitted and received can be masked and erroneously manifested at the receiving end of the system. Ideally, under idle channel conditions, i.e., when no information is present on the input side of the system, the output of the ADC should have a constant zero level value. In practice, however, in a typical ADC, the zero level drifts. Thus, a random or spurious disturbing signal having an extremely small amplitude can cause the ADC to generate an output signal quantizing a value higher or lower than zero, if the zero value level has drifted close to a transition point. This erroneous output signal is then reproduced as an erroneous analog signal downstream at the digital-to-analog converter (DAC).

In systems using a multi-channel input which is sequentially coupled to the ADC, i.e., a multiplexed multichannel system, noise in the form of crosstalk from a nearby channel is typically present. Since the crosstalk noise signal has the spectral content of speech and thus lies within the frequency response range of the system, crosstalk signals of even extremely small amplitude can pass through the system band-pass filter and alter the magnitude of the sampled analog information input signal to a value lying within the next quantizing interval, particularly when the input signal alone is very close to a transition point. As a result, the ADC generates an erroneous output signal which is re-converted to analog form by the DAC. Since the spectrum of this signal is fundamentally that of speech any such noise cannot be filtered out by the postsampling filter downstream of the DAC.

DESCRIPTION OF THE PRIOR ART

Attempts have been made to design systems of the above type with reduced sensitivity to idle channel noise, crosstalk and error in quantizing the analog input signal (termed quantizing errors). In some systems the number of quantizing intervals used to represent the input signal has been increased, thus decreasing the size of each quantizing interval. For systems using binary encoding, it can be shown that adding n bits or $2^n$ quantizing intervals reduces the effect of noise by 6n dB in an ideal case, provided that the analog noise in this system remains small compared to the size of the quantizing interval.

Another technique is to introduce a circuit which has a greater gain for small signals than for large amplitude analog signals, termed a compressor, upstream of the ADC and a circuit having the inverse gain characteristics of the compressor, termed an expander, downstream of the DAC. The compressor-expander arrangement effectively reduces the size of quantizing intervals for small amplitude signals and correspondingly reduces the adverse effects of idle channel and crosstalk noise. However, this arrangement has the disadvantage of introducing a non-linear response over the entire amplitude range of the analog input signals and causes increased quantizing errors for large amplitude signals. A further suggested solution is disclosed in Gunderson, U.S. Pat. No. 3,656,152, wherein a ½ LSB square wave signal is injected into the signal. A 6 dB improvement in signal output is claimed. As is hereinafter explained, further analysis reveals that maximum actual improvement is only 3 dB.

A still further solution has been disclosed which involves the injection of a band limited, amplitude controlled, noise signal having a frequency content outside of the information band of interest prior to analog-to-digital conversion. This technique is disclosed in U.S. Pat. No. 3,999,129, the disclosure of which is incorporated herein by reference. The present invention relates to further improving this signal processing technique for reducing idle channel noise and distortion.

A further discussion of the characteristics of digital to analog to digital conversion is given, hereinafter, in conjunction with a description of the preferred embodiment of the invention.

SUMMARY OF THE INVENTION

The invention comprises a method and apparatus for substantially reducing the adverse effects of idle channel crosstalk and quantizing error noise which can be implemented in an extremely inexpensive manner and which enhances the performance of digital information transmission systems employing analog-to-digital conversion and digital-to-analog reconversion. In a broadest aspect, the invention comprises superposition of an information signal and a controlled signal having a predetermined peak-to-peak amplitude relative to the magnitude of one least significant bit (LSB) and having a predetermined frequency spectrum relative to a frequency at which the composite signal is sampled to convert the information to digital form (sampling frequency). The controlled signal is selected for its noise suppression characteristics and particularly for the ease of extracting information from the composite signal. In a particular embodiment, a class of periodic signals is disclosed which has nearly ideal amplitude distribution and very close to ideal frequency spectral content. The ideal waveform of the controlled signal has a mininum peak-to-peak amplitude, a uniform probability density function and is substantially devoid of frequency components, both in original and aliased form, in the pass-band spectrum of interest. By "substantially devoid of frequency components" it is meant that any such frequency components occurring within the pass band are at an amplitude level lower than the background noise level, for example, at least about 70 dB below the full-scale pass-band amplitude characteristic in a voice grade telephone system. The class of controlled signals includes a periodic symmetric triangle wave at a frequency above or below the pass band which has a peak-to-peak amplitude of at least one least significant bit (LSB) and under non-ideal quantization conditions a preferred peak-to-peak amplitude of about three to about four LSB.

The controlled noise signal is preferably centered at a frequency above the pass band equal to one-half the sampling frequency offset by a small frequency $\delta$ or below the pass band at the small frequency $\delta$. Frequency $\delta$ is selected such that its period is small compared to the time interval of interest in noise evaluation. A typical range of period for frequency $\delta$ in a voice grade telephone system is 10 to 80 Hz.

While the preferred controlled signal is a symmetric sawtooth wave, other suitable signals include asymmetric sawtooth waves, ramp waves and superimposed combinations of square waves of selected peak amplitudes and pseudorandom phase relation. By "symmetric sawtooth wave", a periodic wave is meant consisting of two linear segments of equal duration without any measurable interval of zero slope. By "asymmetric sawtooth wave", a periodic wave composed of two linear segments of unequal duration without any measurable interval of zero slope. By "ramp wave", a periodic wave is meant consisting of two linear segments, one segment being of substantially zero duration relative to the other segment. The "synthesized combination of square waves" is defined in greater detail hereinbelow in The Detailed Description of Preferred Embodiments. It should be further understood that the analog waveforms may be generated using digital techniques.

In a preferred embodiment of an apparatus according to the invention, the information output of an analog signal source is coupled through a pre-sampling filter having a pass-band characteristic co-extensive with a desired operating range of frequencies to a first input of a summing network. A signal generator capable of generating controlled signals of the type noted above is coupled to another input of the summing network. The output of the summing network is coupled to the signal input of an analog-to-digital converter (ADC), the clock input of which is coupled to the output of a sample clock generator. Optionally, a sample and hold circuit also clocked by the sample clock generator output signal train is coupled between the output of the summing network and the data input of the ADC.

As an alternate embodiment, the periodic controlled signal can be injected directly into a comparator input of the ADC, or into any other input interval to the ADC which has the effect of summing the periodic controlled signal with the source signal during conversion. The output of the ADC is coupled to the transmission medium, e.g., a telephone subscriber line circuit or an information bus with a PBX telephone system. At the receiving end of the transmission medium, the digital information signals are reconverted to analog form by a digital to analog converter (DAC) clocked at the same frequency and in synchronism with the sample clock generator. The analog output signals from the DAC are coupled to a utilization device via a post-sampling filter having a pass-band characteristic similar to that of the pre-sampling filter. In the preferred embodiment, the frequency of the periodic controlled noise signal is offset from one half of the sampling frequency in order to prevent the controlled signal from producing an effect equivalent to square waves having the same peak-to-peak amplitudes as the difference between the limited number of samples of the periodic controlled signal.

In operation, the injected periodic controlled signal having the characteristics herein disclosed predominates whenever the amplitude of a spurious noise signal is less than the peak amplitude of the controlled noise signal and the level of the input to the ADC is near a quantizing interval transition point. Thus, in the case of idle channel noise, the subsequent output of the DAC consists primarily of a signal whose frequency components are those of the controlled signal. Since the spectrum of these components is outside of the pass-band of the post-sampling filter, these noise signals are readily filtered out. In the particular case of quantizing error noise, the injected controlled signal acts as a bias signal which, when summed with a lower frequency analog information signal at the input of the ADC, causes the duty cycle of the digitized signal output from the ADC to vary in a manner which is converted by the postsampling filter downstream from the DAC to amplitude changes which more accurately reflect the true shape of the analog input signal. This process is known as dithering since amplitude variations in the analog information input signal which lie within a quantizing level are transmitted to the output of the DAC, thereby reducing quantizing error.

Among the principal advantages of the invention is improved signal to noise characteristics in digitized systems as compared to white noise or Gaussian-type noise dithering techniques, and also as compared to simple controlled signal dithering techniques such as square wave or sine wave signal injection. In particular, the class of preferred injection signals generates highly attenuated harmonics as compared to a square wave. The class of preferred controlled signals is also characterized by a uniform probability density function in contrast to the pure sine wave.

For a fuller understanding of the nature and advantages of the invention, reference should be had to the ensuing detailed description taken in conjunction with the accompanying drawings.

DESCRIPTION OF THE PREFERRED EMBODIMENTS

Figure 1:
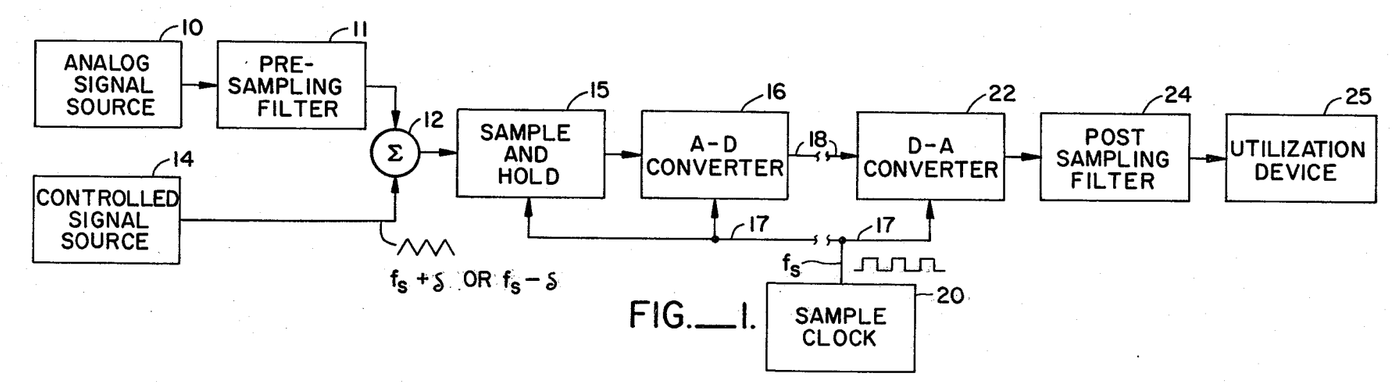
FIG. 1 is a block diagram of a first system embodying the invention.

Turning now to the drawings, FIG. 1 is a block diagram of one system embodying the invention. As shown in this figure, an analog signal source 10 has an output coupled to the input of a pre-sampling filter 11. Signal source 10 may comprise any one of a number of analog information input devices such as a standard telephone handset transmitter, a modem (modulator-demodulator) associated with a data set, a computer voice response unit, or the like, which is capable of generating analog information signals having a frequency content lying predominately within a predetermined pass band. The pre-sampling filter 11 comprises a bandpass filter having a pass-band characteristic substantially coextensive with the range and frequencies of interest. For example, in a pulse code modulated (PCM) telephone system in which the frequency spectrum is about 300 to 3400 Hz, the pre-sampling filter 11 may comprise a 4-pole bandpass filter having a pass band in the range of 300 to 3400 Hz. The output of the pre-sampling filter 11 is coupled to a first input of a conventional summing network. The remaining input to summing network 12 is the output of a controlled source 14.

Figure 6:
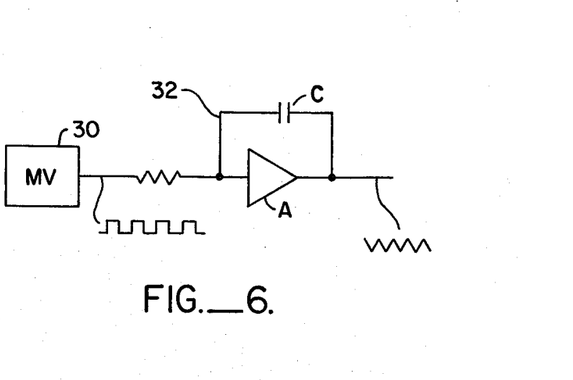
FIG. 6 is a block diagram in partial schematic form illustrating a suitable sawtooth wave generator for producing the controlled signals according to the invention.

The source 14 may comprise any one of a number of known oscillator circuits capable of generating an output signal train having predetermined frequency and amplitude characteristics selected in accordance with the criteria described below. In the preferred embodiment, the controlled noise source is a sawtooth wave generator producing an analog output signal of a preselected frequency and amplitude as hereinafter explained. FIG. 6 illustrates one simple example. The sawtooth wave generator comprises a multivibrator oscillator circuit 30 or an equivalent clock signal coupled through a resistor R to an integrator circuit 32. At its output the multivibrator 30 produces a square wave of the desired frequency. The integrator 32, which includes an amplifier A and timing capacitor C in feedback integrates the square wave output into a sawtooth wave of the same frequency. The amplitude and linearity are determined by the gain of amplifier A and the time constant is determined by capacitor C and resistor R.

The output of the summing network 12 (FIG. 1) is coupled to the signal input of a conventional sample and hold circuit 15, the output of which is coupled with the signal input of a conventional analog-to-digital converter 16 (ADC). The sample and hold circuit 15 and ADC 16 may be incorporated into an integral unit. In embodiments where the signal changes relatively slowly, the sample and hold circuit 16 may be unneeded and therefore may be eliminated. In the preferred embodiment, sample and hold circuit 15 has a settling time of 3.9 microseconds, and the ADC 16 provides a 12 bit parallel binary output signal and is sampled at a sampling frequency selected according to known criteria. The data output of the ADC 16 is coupled to the input of a transmission medium 18, such as a transmission line, a radio link or the like. The sample and hold circuit 15 and the ADC 16 are regulated by a sample clock generator 20 which is coupled through a signal link 17 to clock input terminals of the sample and hold circuit 15 and the ADC 16. The sample clock generator 20 may be a clock pulse generator capable of generating output pulses having a frequency of 12 khz.

Each pulse width of the clock pulse generator is approximately 100 nanoseconds. The frequency of the clock pulse generator is the sampling frequency hereinafter referred to as $f_s$.

Figure 2:
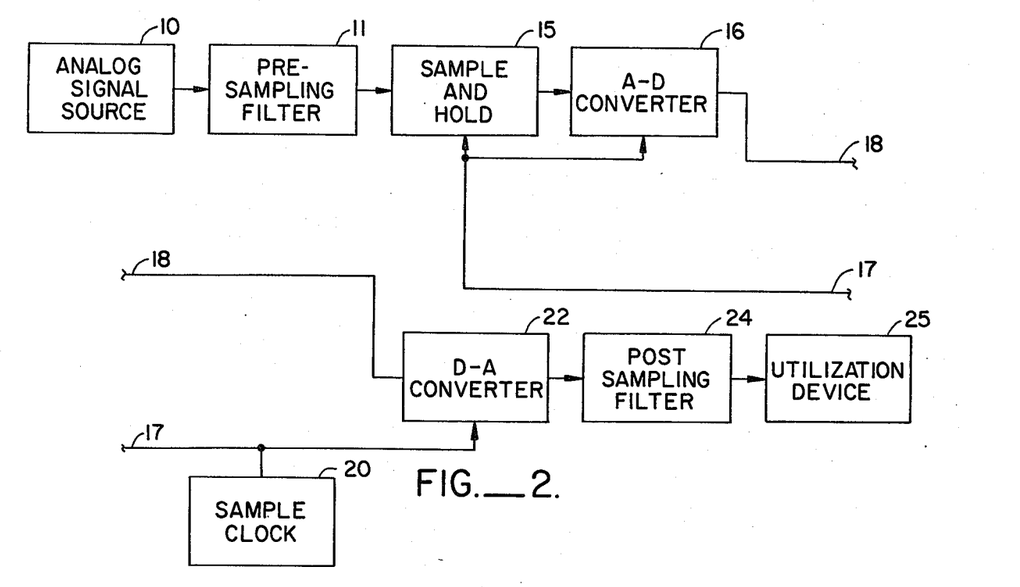
FIG. 2 is a block diagram of a second system embodying the invention.
Figure 8:
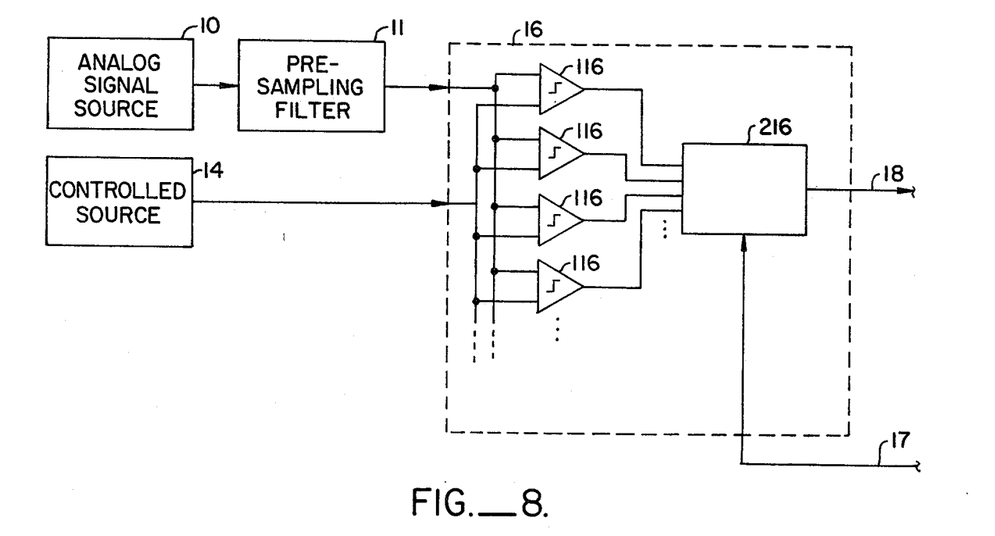
FIG. 8 is a block diagram of a further embodiment of a transmission station according to the invention.

As an alternative embodiment (FIG. 8), the analog signal source 10, coupled through presampling filter 11 is coupled directly to one signal input of comparators 116 within ADC 16 while controlled source 14 is coupled directly to another signal input of the same comparators 116, thereby eliminating a separate summing junction. The digitized output of comparators 116 is decoded through the remaining circuitry 216 of ADC 16 with the aid of a clock signal on line 17 and provided to transmission medium 18. Referring to FIG. 2, the system alternatively comprises analog signal source 10 having its output coupled to the input of presampling filter 12, the output of which is coupled directly to sample and hold circuit 15 which is coupled to ADC 16. The digitized output of ADC 16 is coupled to a digital adder 12'.

Figure 3A:
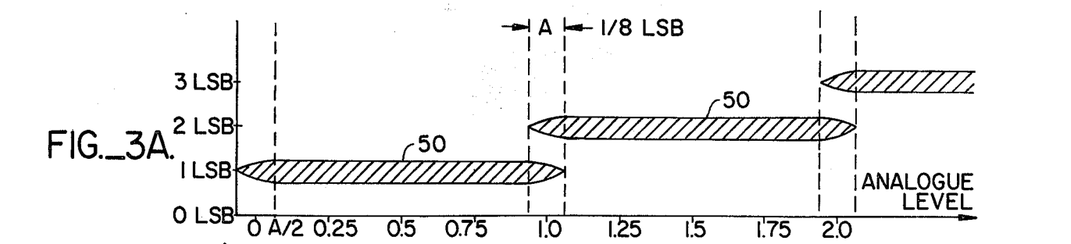
FIG. 3A is a graphical representation of quantization level versus quantization interval obtained by an analog-to-digital conversion followed by a digital-to-analog reconversion of an analog input continuously varied over a number of quantization interval.

In order to more clearly understand the operation of the invention, it is helpful to examine the characteristics of analog-to-digital conversion and digital-to-analog reconversion. FIG. 3A illustrates a voltage representation of a digitized signal verses its analog input counterpart.

The x axis shows the analog input voltage and the y axis shows the digital output converted to its equivalent analog voltage for the values of the input voltage. For each discrete output value, there is a set of corresponding analog input values. In an ideal analog to digital converter, for each input value there is only one corresponding output value or quantization level, and these quantization levels are equally spaced along the y axis. The amplitude of input voltages along the x axis for any single y axis quantization level is the quantization interval. Thus FIG. 3A is a graphical representation of quantization level versus quantization interval.

A physically realizable converter exhibits certain non-ideal characteristics. For example, the separation between each quantization level is generally unequally spaced. Moreover, even with equally spaced levels, the ADC also exhibits error in quantization, depending upon the resolution of conversion. Upon re-conversion of a digitized analog signal to analog form, quantization error appears as distortion. Further, channel noise is present at the input. Therefore, more than one output value exists for a set of input values near a transition point in the quantization interval. The width of overlap of level representations 50, (FIG. 3A) designated A, is a measure of the noise. A average overlap is an input voltage equivalent to about ⅛ LSB.

Figure 3B:
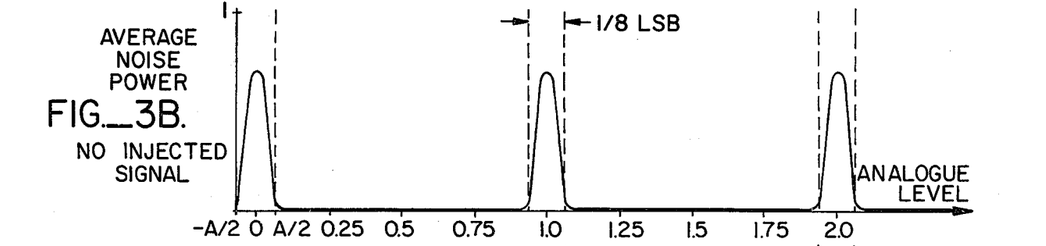
FIG. 3B is a graphical illustration of average noise power versus quantization interval for a system without compensation.

FIGS. 3B through 3E illustrate certain characteristics of a digital transmission system and of the invention which assist the understanding of the invention. To produce the result illustrated in FIG. 3B, a test signal is injected at the controlled source input of summer 12. The test signal comprises a voltage sweep slowly varying from zero volts to the maximum amplitude range of ADC 16. As can be seen in FIG. 3B, where overlap A is present in the quantization intervals 50 (FIG. 3A) increases average noise power is evident in the overlap A. The average noise power level will be as represented in FIG. 3B so long as the overlap A is less than one quantization interval.

Figure 4A:
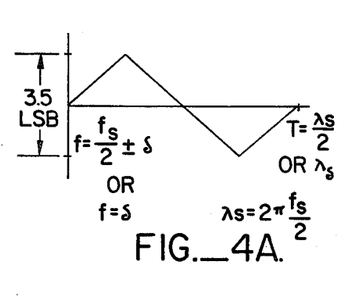
FIG. 4A is a graphical illustration of one sawtooth wave injection signal according to the invention.

According to the invention, the frequency and amplitude of the controlled noise source signal train are selected in accordance with the following criteria. Once the range of frequencies of interest of the analog information signals is chosen, the frequency of sample clock generator 20 can be selected in accordance with the Nyquist criteria. The frequency of sampling is accordingly more than twice the highest frequency in the pass band of interest. The magnitude and number of quantizing intervals can thereafter be selected in accordance with the desired degree of precision and the amplitude range of the analog signals to be processed. Once the sampling frequency and the quantizing intervals are known, the controlled source 14 is adjusted to generate an output signal having frequencies outside the frequency band of interest, that is, outside of the pass band. The most effective signal is a sawtooth wave of at least one LSB peak-to-peak amplitude and preferably about 3.5 LSB peak-to-peak, at a frequency which is offset from one half of the sampling frequency by a relatively small frequency $\delta$. The frequency of the controlled signal above the pass band is designated $\frac{1}{2}f_s+\delta$ or $\frac{1}{2}f_s-\delta$ (hereinafter $\frac{1}{2}f_s\pm\delta$). Alternatively, the controlled signal for below the pass band is a slow periodic sawtooth wave at frequency $\delta$. The periodic sawtooth wave at frequency $\frac{1}{2}f_s\pm\delta$ shown in FIG. 4A is represented by the Fourier expansion:

$$g(t) = \frac{8}{\pi^2} \sum_{n=1,3,5,...}^{\infty} \frac{(-1)^{(n-1)/2}}{n^2} \sin n\pi(f_s \pm \delta')t$$

Where $\delta'=\frac{1}{2}\delta$

A sawtooth wave produces harmonics at odd multiples of the fundamental frequency, for example, a sawtooth wave at $\frac{1}{2}f_s\pm\delta$ i.e., 3,5.7, etc., times the quantity of $\frac{1}{2}f_s\pm\delta$. After sampling, the fundamental and the harmonics are aliased such that a signal is reproduced at $\frac{1}{2}f_s\pm\delta$, $\frac{1}{2}f_s\pm3\delta$, $\frac{1}{2}f_s\pm5\delta$, etc. Similarly, a sawtooth wave at frequency $\delta$ produces harmonics at $3\delta$, $5\delta$, $7\delta$, etc., which is aliased to $f_s-\delta$, $f_s-3\delta$, etc. The amplitude of various harmonics of a sawtooth wave is highly attenuated as compared to the fundamental. For example, the sawtooth wave produces no second harmonic, and the third harmonic is 10.08 dB lower than the fundamental, the fifth harmonic is 27.95 dB lower than the fundamental and the other harmonics are even lower. The natural harmonics are generally outside the spectrum of frequencies of interest and are highly attenuated.

Figure 4B:
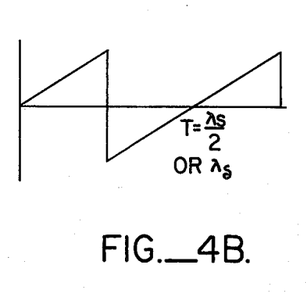
FIG. 4B is a graphical illustration of a ramp wave injection signal according to the invention.
Figure 4C:
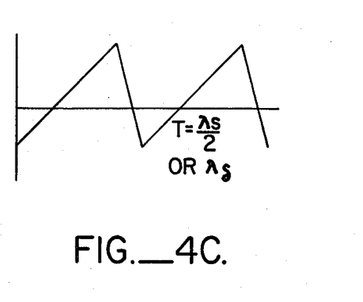
FIG. 4C is a graphical illustration of another sawtooth wave injection signal according to the invention.

The ideal waveform is a symmetric triangle wave at a frequency $\frac{1}{2}f_s\pm\delta$ or at $\delta$, which has a uniform probability density function and minimal higher frequency components, and an amplitude of at least 1 LSB and preferably about 3.5. LSD. Other waveforms of suitable characteristics are the ramp function (FIG. 4B). The periodic ramp function at $\frac{1}{2}f_s\pm\delta$ is represented by the Fourier expansion:

$$g(t) = \frac{1}{2} - \frac{1}{\pi} \sum_{n=1}^{\infty} \frac{1}{n} \sin n\pi(f_s \pm \delta')t.$$

The Fourier expansion of the periodic asymmetric sawtooth wave can also be derived. The exact form depends on the relative periods of the various phase segments.

To further clarify the characteristics of the preferred waveform of the controlled signal, it will be recognized that a sawtooth wave at a frequency $\frac{1}{2}f_s \pm \delta$ is quite similar to a square wave signal having a fundamental frequency at $\frac{1}{2}f_s$ which is a double side band suppressed carrier amplitude modulated by a sawtooth wave of frequency $\delta$.

An amplitude modulated square wave can be used in a practical system. Such a signal is however more difficult to produce than a simple triangle wave at the designated frequency, which for example could be generated by the circuit of FIG. 6.

Figure 4D:
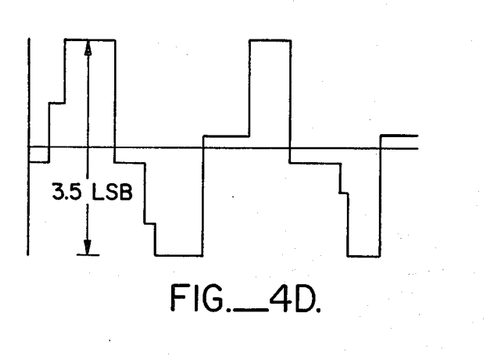
FIG. 4D is a graphical illustration of a composite wave injection signal according to the invention.
Figure 7A:
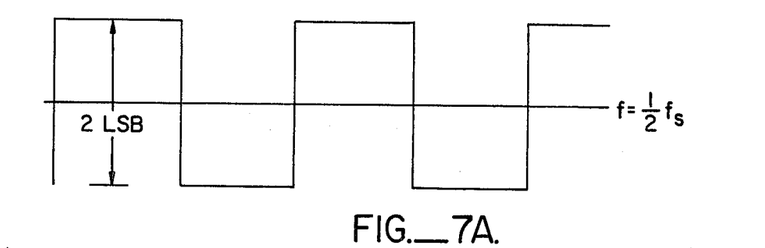
FIGS. 7A-7C are a graphical illustration of selected components of the composite signal of the type illustrated in FIG. 4D.
Figure 7B:
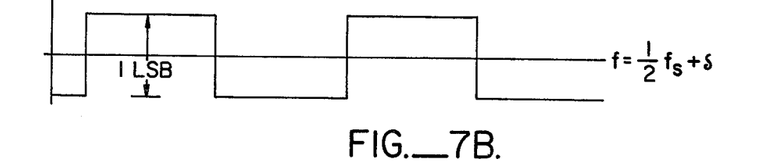
Figure 7C:
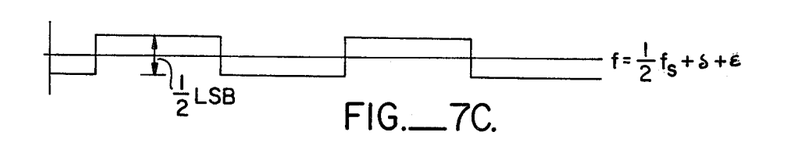

A further alternative embodiment to the simple triangle wave generator is a composite wave produced by a combination of discrete square waves of selected amplitude and pseudo-random phase relation. A waveform of such a signal at a selected point in time is shown in FIG. 4D. Referring to FIG. 7, there is illustrated a series of square waves comprising the waveform of FIG. 4D. The fundamental square wave (FIG. 7A) has a peak-to-peak amplitude of $\frac{1}{2}$ LSB synchronized with the sampling signal of $\frac{1}{2}f_s$. The second square wave (FIG. 7B) is at a level of $\frac{1}{4}$ LSB at a frequency of $\frac{1}{2}f_s - \delta$, the third square wave (FIG. 7C) is at a level of $\frac{1}{8}$ LSB at a frequency of $\frac{1}{2}f_s - \delta - \epsilon$, etc., ($\epsilon$ indicates that the offset of the smaller amplitude square waves are in the same range as $\delta$ but not so close to the frequency of each other as to create slowly varying noise effects which are audible in a voice telephone system). The selection of square waves of differing frequencies without synchronization creates a pseudo-random phase relation. A properly selected series of square waves summed together produces the correct probability density function and frequency spectrum and slowly varying noise effects are minimized if the individual frequencies are not too close to each other, that is, they are separated by at least 10 Hz for voice telephone applications. While such a signal-generating technique may be employed, by present technology it is generally considered preferable to use a single sawtooth wave at a selected frequency.

EXPERIMENTAL EXAMPLES

Having thus explained the characteristics of the controlled signal operation, it is helpful to consider more closely how the injection or digital adding technique herein described functions to improve the performance of the inventive system. Referring to FIG. 3B, a given amount of input noise to the ADC 16 has a particular amplitude probability density function, such that if the amplitude offset (the x axis) to the ADC is slowly varied through a bit transition point, the noise probability density function will be reflected in the output noise of the DAC 22. In FIG. 3B, the input noise is a pseudo-Gaussian signal of a level of $\frac{1}{8}$ LSB peak-to-peak. FIG. 3B shows this noise level at the output of DAC 22 normalized to a unit level.

Figure 3C:
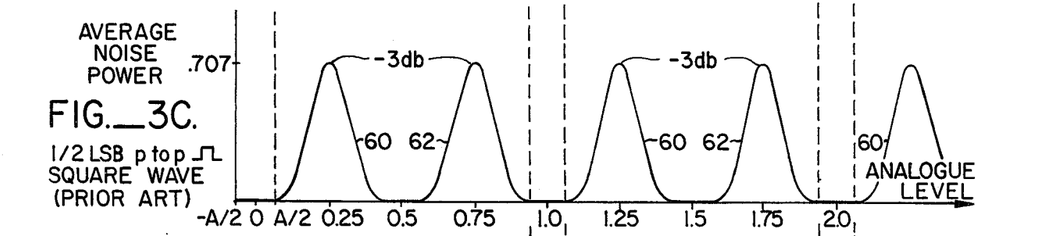
FIG. 3C is a graphical illustration of average noise power versus quantization interval for a prior art noise suppression technique.

An injected controlled signal of $\frac{1}{2}$ LSB square wave peak-to-peak produces the result shown in FIG. 3C. A 3 dB improvement is noted over the idle channel noise level of FIG. 2B. However, earlier work, specifically Gunderson, U.S. Pat. No. 3,656,152, indicated that a 6 dB improvement theoretically results from the addition of a $\frac{1}{2}$ LSB square wave. Further theoretical analysis and experimental verification indicates that the injection of $\frac{1}{2}$ LSB square wave produces (at the analog to digital converter output) with the worst case offset the same noise level as with no injected square wave, although the noise is present only in every other sample. The amplitude of 50% duty cycle modulated noise signal is 3 dB less than that of an unmodulated noise signal. Hence, Gunderson's technique can only result in a 3 dB improvement. Even 3 dB of improvement is unobtainable if the idle channel noise level is greater than about $\frac{1}{4}$ LSB peak-to-peak since the tails 60,62 (FIG. 3C) of the distributions of the probability density function thereby obtained when the injected controlled source square wave according to Gunderson are added to the noise signal will overlap and add up to greater than the peak amplitude.

Figure 3D:
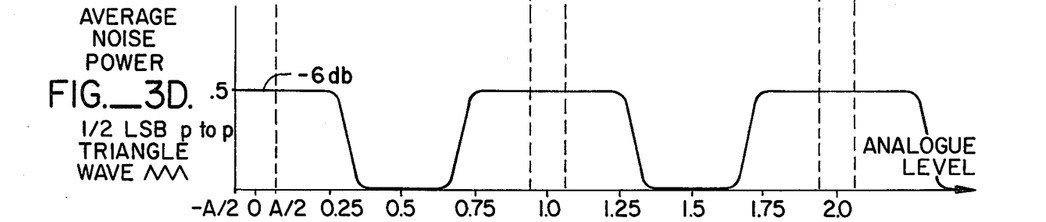
FIG. 3D is a graphical illustration of average noise power versus quantization interval for the noise suppression technique of the present invention wherein the amplitude of injected noise suppression is less than optimum.

In the case of a $\frac{1}{2}$ LSB peak-to-peak injected sawtooth wave having the characteristic according to the present invention, a 6 dB improvement is obtained, where $\frac{1}{8}$ LSB peak-to-peak noise is present. FIG. 3D illustrates such a characteristic. By comparison with the waveform of FIG. 3C it can be seen that no overlap in noise signal results at this signal level in the technique according to the invention.

Figure 3E:
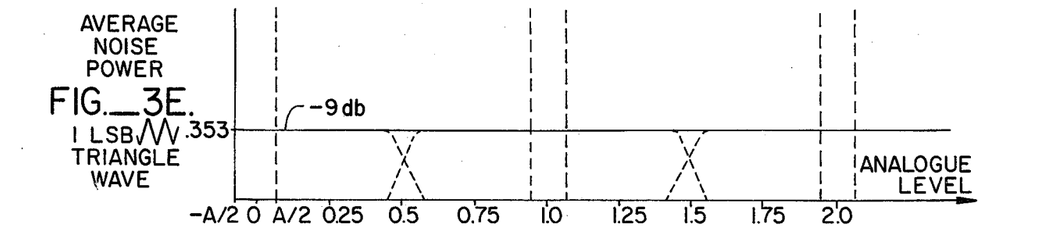
FIG. 3E is a graphical illustration of average noise power versus quantization interval for the inventive noise suppression technique in operation in an analog to digital converter having equally spaced quantization levels.

According to the invention, where less than 1 LSB peak-to-peak equivalent level noise of any form is present in a system having evenly spaced quantization intervals, a 1 LSP peak-to-peak injected triangle wave control signal produces maximum attenuation. As shown in FIG. 3E, a 1 LSB peak-to-peak injected controlled signal produces a 9 dB improvement where the noise is equivalent to a level of $\frac{1}{8}$ LSB peak-to-peak. Moreover, the noise is also substantially evenly distributed over the amplitude of the analog signal. The improvement for a 1 LSB triangle wave is proportional to $\sqrt{B/N}$, where N is the width of the LSB and B is the RMS value of the equivalent noise (quiescent noise) at the input of the ADC.

The injection of a one LSB peak-to-peak triangle wave dithering signal produces a 6 dB improvement where the ADC has $\frac{1}{2}$ LSB equivalent noise at its input, and a 12 dB improvement is possible where the ADC has a 1/16th LSB equivalent noise at its input.

In most information transmission systems utilizing digital transmission, there is a significant departure from the ideal of exactly equal quantization levels. Thus, some bit transitions may be unevenly spaced throughout the range of the ADC and DAC. For example, if bit transition levels are displaced by $\frac{1}{2}$ LSB from their ideal levels, there may be two transitions within $\frac{1}{2}$ LSB of each other. As a result, injection of a $\frac{1}{2}$ LSB peak to peak square wave produces no improvement due to the superposition of adjacent noise peaks. Nevertheless, the injection of a sawtooth wave of the same amplitude will improve the signal-to-noise ratio. In such a case, the improvement would be 3 dB less than that obtainable with an ideal ADC.

The result is improved noise attenuation without significant degradation of system performance while it is generally taught in the prior art that the amplitude of the dithering signal should not be great as compared to the amplitude of one LSB, according to the present invention, the dithering signal is chosen to be a three to four LSB waveform having a uniform probability density function.

Figure 3F:
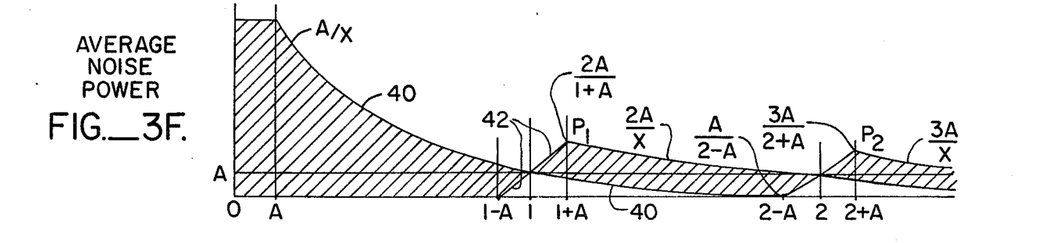
FIG. 3F is a graphical illustration of the probability of occurrence of output noise over a number of quantization intervals for an injected controlled signal having a linear increase in amplitude and random starting location with respect to a quantization transition.

A brief explanation of the reason for such an improved attenuation in noise characteristic is given in connection with FIG. 3F.

In FIG. 3F there is shown graphically the expected amplitude of average noise power of a waveform of uniform probability density function at the output of a DAC where the quiescent level of the input is swept from level zero to a level x for any arbitrary starting location. If the sweep waveform is of amplitude x and begins at A/2 below a quantization transition time zero, the noise power will follow the curve 40 of FIG. 3F. However, if the sweep is of amplitude x but starts at A/2 above a quantization transition the noise power will be given by curve 42 of FIG. 3F. Noise is minimized at the transition points, if they are known. However, for any arbitrary starting point, the amplitude of the noise for these quantization intervals will lie between these two curves 40 and 42, the peak noise for first quantization interval being equal to 2A, the peak at the second quantization interval being 3/2A, and the peak at the $n^{th}$ quantization interval being $(n+1)/n$. A, where A is small compared to the quantization interval.

Figure 5:
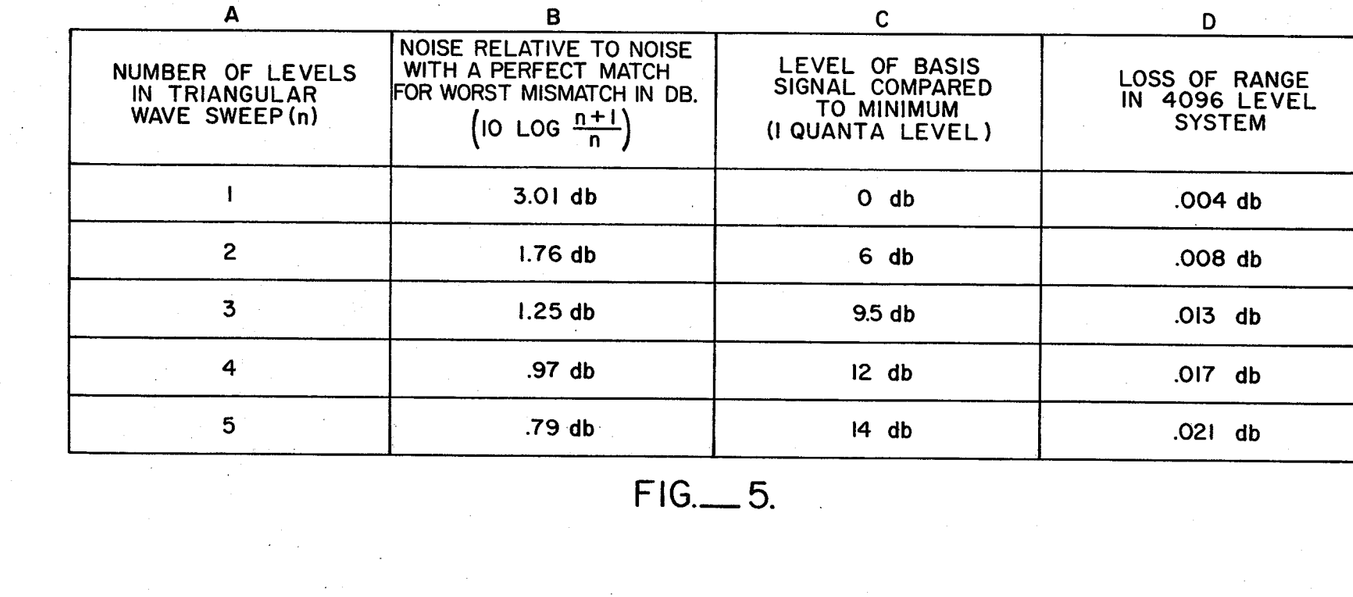
FIG. 5 is a table setting forth the performance characteristics of the system of FIG. 1 utilizing controlled source signals of the type illustrated in FIG. 4.

FIG. 5 is a table showing the noise relative to perfect match for the greatest bit level mismatch (column B) and the corresponding level of the basis signal as compared to a minimum of one quantum level (column C), as well as the corresponding loss of amplitude range (column D) in a 12 bit ADC/DAC system utilizing a controlled noise source triangular wave sweep at selected amplitudes (column A). The information in column B corresponds to the extremum illustrated in FIG. 3F.

The frequency of the quiescent level sweep is also important. If the quiescent level is swept too slowly over the quantization intervals, i.e., at less than about 10 Hz, the effect will be audible to a listener as a pulsing. However, if the rate of sweep exceeds about 300 Hz, the effect will be an audible tone in the pass band. Therefore, the sweep rate is preferably above 10 Hz and below 300 Hz and specifically the best results can be obtained in the range from about 20 Hz to about 60 Hz. Applying these criteria, the range of frequency offset δ is about 20 Hz to about 60 Hz.

Referring again to FIG. 1 by way of further explanation of the system, the output of the ADC 16 is coupled to the transmitting end of a transmission medium 18. Transmission medium carries the composite digitized signal to a receiving station at a receiving end.

At the receiving end of the system, the digital information signals on transmission medium 18 are coupled to the data input of a conventional digital-to-analog converter (DAC) 22 having a resolution of 2.5 millivolts per LSB and an output range co-extensive with the analog input range of ADC 16, where the quantizing interval of the ADC 16 is selected to be 2.5 millivolts per LSB. The clock input of DAC 22 is coupled to the output of sample clock 20 by means of conductor 17 so that DAC 22 is clocked at the same rate as ADC 16. The output of DAC 22 is coupled to the input of a post-sampling filter 24, which comprises a bandpass filter having a pass-band characteristic generally similar to that of pre-sampling filter 11. The output of a suitable utilization device 25, e.g., a standard telephone hand-set receiver.

In operation, analog information signals from analog signal source 10 are passed through pre-sampling filter 11, where undesired frequency components are substantially reduced or eliminated, and summed in summing junction 12 with the periodic controlled signals from source 14, the composite signal is sequentially sampled in sample and hold circuit 15 and converted to digital form in ADC 16, with both sampling and conversion occurring at the sampling rate $f_s$. The received digital information signals conducted along the transmission medium 18 are reconverted into analog form by DAC 22, which is also clocked at the rate of $f_s$. The resulting analog signal output from DAC 22 is filtered by post-sampling filter 24 to remove substantially all frequency components lying outside the desired frequency band rate, and then it is coupled to the utilization device 25.

A system incorporating such a controlled signal source according to the invention is capable of significantly reducing unwanted noise. Moreover, the invention can be readily applied to existing digital information transmission systems by simply adding the summing network 12 and controlled signal source 14 at the data input of an existing sample and hold circuit. It should be noted that the signal may be coupled directly to the data input of the ADC. Furthermore, while the invention has been specifically described with reference to a digital information transmission system, the invention may also be employed in other signal processing systems, such as digital, audio or video recording systems, to great advantage. It should be further noted that the invention may be employed in digital information systems which include a compressor upstream of the ADC and expander down stream of the DAC.

In addition, the invention permits improvement in various components in a physically realizable system. For example, a typical summing network 12 may include a 20 megohm mixing resistor where the quantization level is selected to be only 1 LSB. However, in a system utilizing a 3.5 quantization level sweep, a proportionately smaller mixing resistor may be used with the resulting reduction in random noise.

While the above provides a full disclosure of preferred embodiment, various modifications, alternate constructions and equivalents may be employed without departing from the true spirit and scope of the invention. Therefore, the above description and illustration should not be construed as limiting the scope of the invention except as indicated by appended claims.

We claim:

1. A method for reducing noise in a digital information transmission system, said method comprising the steps of:
   a. generating an analog input signal having a spectral content lying within a predetermined operating frequency band;
   b. generating a periodic controlled signal having a spectral content substantially devoid of frequency components within the limits of said operating frequency band;
   c. providing a digital signal at a pre-selected sampling rate to a transmission medium, said digital signal representing a composite of said analog input signal and said periodic controlled signal, said analog input signal being quantized with a predetermined number of quantizing levels of predetermined magnitude, and said periodic controlled signal having an amplitude satisfying the conditions of the uniform probability density functions and a peak-to-peak amplitude of not less than one quantization level;
   d. converting said digital signal to analog form at a receiving end of said transmission medium; and
   e. filtering said converted analog signal to remove substantially all frequency components lying outside of said predetermined operating frequency band.

2. The method according to claim 1 wherein said step b. comprises generating a periodic controlled signal centered at a frequency slightly offset from one half of the frequency of said sampling rate.

3. The method according to claim 1 wherein said step b. comprises generating a periodic controlled signal centered at a frequency between about 10 Hz and about 300 Hz.

4. The method according to claim 3 wherein said periodic controlled signal is centered at a frequency between 20 Hz and 60 Hz.

5. The method according to claim 1 wherein said step c. of providing a digital signal comprises combining said analog input signal and said periodic controlled signal to produce a composite signal and converting said composite signal to digital form at said pre-selected sampling rate.

6. The method of claim 1 wherein said periodic controlled signal is a symmetric sawtooth wave.

7. The method according to claim 1 wherein said periodic controlled signal is an asymmetric sawtooth wave.

8. The method according to claim 1 wherein said periodic controlled signal is a ramp wave.

9. The method according to claim 1 wherein said periodic controlled signal is the algebraic sum of a composite of periodic square wave signals differing in frequency and amplitude, the square wave of largest amplitude being at a frequency equal to one half of the sampling rate, and the other square wave signals being slightly offset from one half of the sampling rate and slightly offset from one another, each of said other square wave signals being of an amplitude not in excess of $1/n^2$ of the maximum amplitude, where n is an integer greater than one.

10. A method for reducing idle channel, crosstalk and quantizing error noise in a digital information transmission system, said method comprising the steps of:
  a. generating an analog input signal having a spectral content lying within a predetermined operating frequency band;
  b. generating a periodic controlled signal in the form of a sawtooth wave, whose amplitude satisfies the conditions of the uniform probability density function, with a spectral content substantially devoid of frequency components within the limits of said operating frequency band;
  c. combining said analog input signal and said periodic controlled signal to produce a composite signal;
  d. converting said composite signal to digital form at a pre-selected sampling rate and providing said digital signal to a transmission medium, said digital signal being quantized with a predetermined number of quantizing levels of predetermined magnitude, wherein the frequency of said periodic controlled signal is offset from the frequency of said sampling rate between about 10 Hz and about 300 Hz and said periodic controlled signal has a peak-to-peak amplitude of at least one quantizing level and not substantially greater than about 3.5 quantizing levels;
  e. receiving said digital signals at a receiving end of said transmission medium and converting said composite digital signal to analog form; and
  f. filtering said converted analog signal to remove substantially all frequency components lying outside of said predetermined operating frequency band.

11. The method of claim 10 wherein the amplitude of said periodic controlled signal is approximately 3.5 quantizing levels.

12. A method for reducing idle channel, crosstalk and quantizing error noise in a digital information transmission system, said method comprising the steps of:
  a. generating an analog input signal having a spectral content lying within a predetermined operating frequency band;
  b. generating a periodic controlled signal in the form of a ramp wave, whose amplitude satisfies the conditions of the uniform probability function, with a spectral content substantially devoid of frequency components within the limits of said operating frequency band;
  c. combining said analog input signal and said periodic controlled signal to produce a composite signal;
  d. converting said composite signal to digital form at a pre-selected sampling rate and providing said digital signal to a transmission medium, said digital signal being quantized with a predetermined number of quantizing levels of predetermined magnitude, wherein the frequency of said periodic controlled signal is offset between about 10 Hz and 300 Hz from a frequency which is one half of the frequency of said sampling rate and said periodic controlled signal has an amplitude of at least one quantizing level and not substantially greater than about 3.5 quantizing levels;
  e. receiving said digital signals at a receiving end of said transmission medium and converting said composite digital signal to analog form; and
  f. filtering said converted analog signal to remove substantially all frequency components lying outside of said predetermined operating frequency band.

13. A system for transmitting information from a first location to a second location in digital form with reduced communication errors due to noise, said system comprising:
  input terminal means adapted to be coupled to a source of information signals at said first location, said information input signals having a spectral content lying within a predetermined operating frequency band;
  means for generating a periodic controlled signal having a spectral content substantially devoid of frequency components within the limits of said operating frequency band;
  means coupled to said input terminal means and said periodic controlled signal generating means for combining said information signal and said periodic controlled signal to produce a composite signal;
  means coupled to said combining means for converting said composite signal to digital form which is quantized with a predetermined number of quantizing levels, each level having a predetermined magnitude at a predetermined sampling rate, said periodic controlled signal having an amplitude satisfying the conditions of the uniform probability density function and a peak-to-peak amplitude of not less than one quantizing level;
  transmission means having an input coupled to the output of said converting means for transmitting said digital signals to said second location;

means at said second location for reconverting said digital signals to equivalent analog signals; and means for filtering said equivalent analog signals to remove substantially all frequency components lying outside of said predetermined operating frequency band.

14. The system of claim 13 wherein said periodic controlled signal generating means comprises a sawtooth wave generator operative to produce a sawtooth wave having a maximum peak-to-peak amplitude of between one quantizing level and about 3.5 quantizing levels.

15. The system of claim 14 wherein the fundamental frequency of said sawtooth wave generator is centered at a frequency offset between about 10 Hz and about 300 Hz of one half the frequency of said sampling rate.

16. The system of claim 15 wherein said frequency offset is between 20 Hz and 60 Hz of one half of said sampling rate frequency.

17. An apparatus for converting analog signals to equivalent digital signals for subsequent processing, said apparatus comprising:

input terminal means adapted to be coupled to a source of information signals, said information input signals having a spectral content lying within a predetermined operating frequency band;

means for generating a periodic controlled signal having a spectral content substantially devoid of frequency components within the limits of said operating frequency band;

means coupled to said input terminal means and said periodic controlled signal generating means for combining said information signal and said periodic controlled signal to produce a composite signal; and means coupled to said combining means for converting said composite signal to digital form which is quantized with a predetermined number of quantizing levels, each level having a predetermined magnitude at a predetermined sampling rate, said periodic controlled signal being characterized by a uniform amplitude probability density function, and a maximum peak-to-peak amplitude of not less than one quantizing level.

18. An apparatus according to claim 17 wherein said periodic controlled signal generating means comprises a sawtooth wave generator operative to produce a sawtooth wave having a maximum peak-to-peak amplitude of between one quantizing level and about 3.5 quantizing levels.

19. An apparatus according to claim 18 wherein the fundamental frequency of said sawtooth wave generator is centered at a frequency which is offset between about 10 Hz and about 300 Hz of one half the frequency of said sampling rate.

20. An apparatus according to claim 19 wherein said frequency offset is between 20 Hz and 60 Hz one half of said sampling rate frequency.

21. An apparatus according to claim 18 where the fundamental frequency of said sawtooth wave generator is centered at a frequency of between about 10 Hz and about 300 Hz.

22. An apparatus according to claim 21 wherein said fundamental frequency is between 20 Hz and 60 Hz.

* * * * *